United States Patent [19]

Iwata et al.

[11] Patent Number: 5,392,012
[45] Date of Patent: Feb. 21, 1995

[54] PIEZOELECTRIC FILTER IN A CASING SEALED BY AN INSULATING FILLER AND HAVING CRANKED CONNECTING LEGS

[75] Inventors: Tatsuo Iwata; Tatsuo Ogawa; Yasuhiko Nakagawa, all of Nagoya, Japan

[73] Assignee: NGK Spark Plug Co., Ltd., Aichi, Japan

[21] Appl. No.: 944,989

[22] Filed: Sep. 15, 1992

[30] Foreign Application Priority Data

Sep. 18, 1991 [JP] Japan ............... 3-084374[U]
Sep. 21, 1991 [JP] Japan ............... 3-084819[U]
Sep. 21, 1991 [JP] Japan ............... 3-084820[U]

[51] Int. Cl.⁶ ................ H03H 9/10; H03H 9/58
[52] U.S. Cl. .................. 333/189; 310/348; 310/355
[58] Field of Search ............ 333/187–192; 310/348, 355; 174/52.2, 52.3

[56] References Cited

U.S. PATENT DOCUMENTS

| | | | |
|---|---|---|---|
| 4,656,385 | 4/1987 | Tanaka | 333/189 X |
| 4,864,259 | 9/1989 | Takamoro et al. | 333/189 |
| 5,057,802 | 10/1991 | Ozeki et al. | 333/189 |

FOREIGN PATENT DOCUMENTS

| | | | |
|---|---|---|---|
| 188216 | 10/1984 | Japan | 333/187 |
| 210905 | 8/1990 | Japan | 333/187 |
| 181217 | 8/1991 | Japan | 333/189 |

Primary Examiner—Benny Lee
Attorney, Agent, or Firm—Larson & Taylor

[57] ABSTRACT

A piezoelectric filter device having one or more pairs of piezoelectric resonators for forming a ladder-type filter circuit, a plurality of terminal plates including an input and output terminal plates for electro-mechanically holding respective resonators at oscillation nodes, and a casing for containing the piezoelectric resonators and the terminal plates and having an opening which is closed by an insulating filler, in which the opening has an inner peripheral rough surface with which the insulating filler is securly bonded. The casing has a connecting extention extending from the bottom wall thereof which is longer than cranked or bent connecting legs of the input and output terminal plates. Alternatively, each cranked or bent connecting leg has a width larger than that of its tip portion to be connected to a printed-circuit board.

2 Claims, 5 Drawing Sheets ically holding respective resonators at oscillation nodes and insulating plates arranged in a metal casing and electrically connected to form a ladder-type filter circuit as illustrated in FIG. 1 or 2. The ladder-type filter circuit illustrated in FIG. 1 is of an inverted L connection type comprising a piezoelectric resonator A branched in series and a piezoelectric resonator B branched in parallel. The ladder-type filter circuit illustrated in FIG. 2 is of a multistage type comprising four piezoelectric resonators A for series branch and three piezoelectric resonators B for parallel branch.

PIEZOELECTRIC FILTER IN A CASING SEALED BY AN INSULATING FILLER AND HAVING CRANKED CONNECTING LEGS

BACKGROUND OF THE INVENTION

The present invention relates to a piezoelectric filter device having a plurality of piezoelectric resonators and designed for use with a portable telephone set or the like.

In general, a conventional piezoelectric filter device of this kind comprises one or more pairs of piezoelectric filters, a corresponding number of terminal plates for electro-mechanically holding respective resonators at oscillation nodes and insulating plates arranged in a metal casing and electrically connected to form a ladder-type filter circuit as illustrated in FIG. 1 or 2. The ladder-type filter circuit illustrated in FIG. 1 is of an inverted L connection type comprising a piezoelectric resonator A branched in series and a piezoelectric resonator B branched in parallel. The ladder-type filter circuit illustrated in FIG. 2 is of a multistage type comprising four piezoelectric resonators A for series branch and three piezoelectric resonators B for parallel branch.

Besides, connector legs extend from some of the terminal plates such as an input and output terminal plates through the opening of the casing, which is closed by an insulating filler made of a resin material such as epoxy resin. The portion of each connector leg extending externally through the insulating filler is cranked or bent so that the filter device may be surface-mounted on a printed-circuit board by way of the externally extended portions of the connector legs. An example of such a conventional filter device is disclosed in U.S. Pat. No. 4,864,259.

In the conventional filter device as mentioned above the opening of the metal casing into which the insulating filler is filled has a smooth inner surface. When the insulating filler inserted into the opening is solidified and bonded the filler may be contracted so as to produce some crevices between the inner surface of the opening and the filler. Consequently, the tightness of the metal casing may be impaired and thus condensation may form the inner portion of the metal casing thereby resulting in a poor insulation.

The connector legs are bonded to electrical conductive paths printed on the printed-circuit board by soldering paste. If the soldering paste is laid too thick on the surface of the conducting members, wax may flow out of the soldering paste to make the operation of mounting the piezoelectric filter unnecessarily expensive and the overall height of the piezoelectric filter mounted on the printed-circuit board undesirably high. There are disadvantages that in turn hinder any attempt at reducing the size of the portable telephone set in which the filter is incorporated. In order to overcome this problem, soldering paste is recently required to be laid on very thin to form a layer having thickness of approximately 100 µm. Since such a thin layer of solder can adversely affect the strength of bonding, a method of using a very thin connector having a thickness of approximately 0.1 mm and pressing it on heated soldering paste has recently been introduced. With such a method, the soldering paste partly comes up and covers the upper surface of the connector to substantially increase the overall bonding area.

A piezoelectric filter prepared in this way is then automatically mounted on the printed-circuit board and rigidly fitted thereto by soldering. In this mounting process, generally, a chucker is used to hold the piezoelectric filter at the free end of the connector legs projecting from the metal casing and the rear wall of the casing and carries it to a mounting station using a chip mounter. However, since the connector legs are made very thin as described above, each connector leg held by the chucker can be easily deformed by the force exerted and lose its flatness at its free end which is connected to the printed-circuit board. Therefore, a piezoelectric filter having such deformed connector legs cannot be fitted to a printed-circuit board in a neat and orderly manner.

Also, the thinning of the connector legs eventually reduces the stiffness thereof and results in the unstable mounting of the filter device on the printed-circuit board.

SUMMARY OF THE INVENTION

It is therefore an object of the present invention to provide a piezoelectric filter device in which the generation of any crevices between the inner surface of the opening and the filler can be avoided and a tightness of a metal casing can be ensured.

Another object of the present invention is to provide a piezoelectric filter device having connector legs which are, if made very thin, immune from deformation when it is subjected to any external force or impact which may be generated during prepartion or mounting process.

According to the present invention, there is provided a piezoelectric filter device comprising one or more pairs of piezoelectric resonators, a plurality of terminal plates including an input and output terminal plates for electro-mechanically holding respective resonators at oscillation nodes, the input and output terminal plates being respectively provided with connecting legs, at least one insulating plate, a casing for containing the piezoelectric resonators and the terminal plates which are stacked to form a ladder-type filter circuit and having an opening through which the connector legs are externally projected, and an insulating filler for flatly closing the opening of the casing, the connector legs being cranked or bent and used for surface-mounting the piezoelectric filter device on a printed-circuit board, the opening of the casing being provided with an inner peripheral rough surface with which the insulating filler is securly bonded.

Preferably, the casing may be a metal casing which has a lower wall provided with a connector leg externally extending from the edge of the opening.

The connecting legs of the input terminal plate, the output terminal plate and the metal casing may preferably be extended in the same direction.

By the provision of the rough surface on the inner wall of the opening of the metal casing, there can be obtained a very good contact of the insulating filler with the inner wall surface of the opening so that no crevice can be formed therebetween.

In the preferable embodiment, the base portion of each cranked or bent connecting leg may have a width larger than that of its tip portion to be connected to the printed-circuit board.

Further, the metal casing may have a connecting extention extending from the lower wall thereof, and may be made longer than the connecting legs of the terminal plates.

The present invention will now be described by way of example with reference to the accompanying drawings:

DETAILED DESCRIPTION OF THE INVENTION

Figure 1:
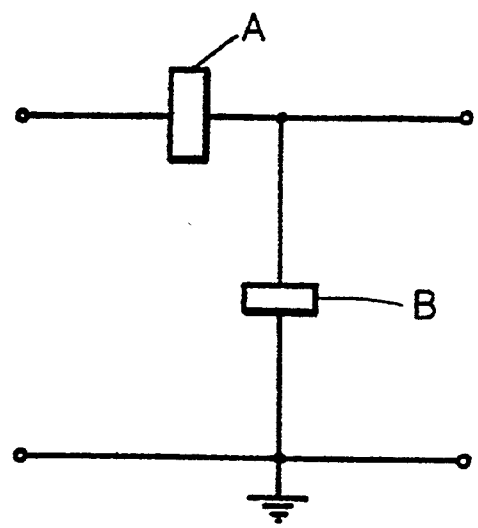
FIG. 1 is an equivalent circuit diagram of a ladder-type filter circuit having an inverted L-connection type filter unit.

Referring to FIGS. 3 to 6, there is shown a ladder-type piezoelectric filter device according to an embodiment of the present invention in which it is designed to form a ladder-type filter circuit of an inverted L-connection shown in FIG. 1.

Figure 3:
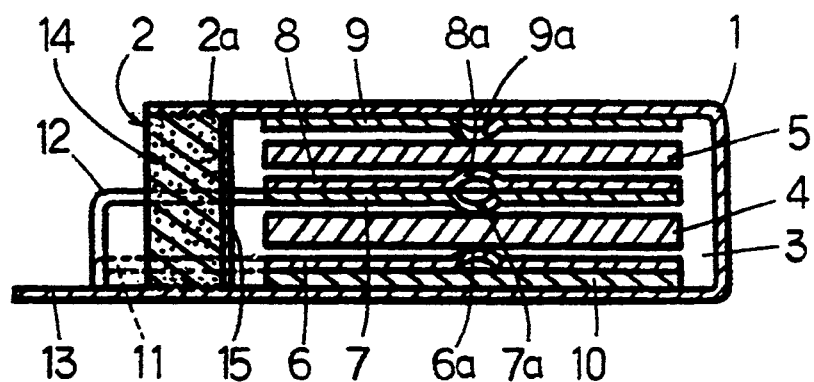
FIG. 3 is a longitudinal section schematically showing a piezoelectric filter device according to a embodiment of the present invention.

In FIG. 3, the reference numeral 1 represents a thin casing of a box-shape which has an opening 2 at one side portion and an inner space 3 for containing a filter assembly in a superimposed or stacked and electrically insulated condition. The casing 1 is made of metal such as nickel silver or the like which is capable of soldering. The filter assembly is inserted into the inner space 3 through the opening 2, and comprises a thick piezoelectric resonator 4 with a small capacity to be arranged to form a series branch of a ladder-type filter circuit and a thin piezoelectric resonator 5 with a large capacity to be arranged to form one parallel branch of the filter circuit. Rectangular terminal plates 6, 7, 8 and 9 are integrally provided with respective protuberances 6a, 7a, 8a and 9a which are positioned so that each protuberance abuts on the associated vibrating node of the piezoelectric resonator 4 or 5 when being assembled. Therefore, these protuberances 6a, 7a, 8a and 9a are served to electrically and mechanically support the piezoelectric resonators 4 and 5. Of these terminal plates, the plate 6 is an input terminal plate and the plate 7 is an output terminal plate, while the plates 8 and 9 are an interconnecting terminal plate and a grounding terminal plate, respectively. Upon assembling of the piezoelectric filter device, one surface of the piezoelectric resonator 4 is connected to the input terminal plate 6 via its protuberance 6a, and the other surface of the resonator 4 is connected to the output terminal plate 7 via its protuberance 7a. Similarly, one surface of the piezoelectric resonator 5 is connected to the intermediate terminal plate 8 via its protuberance 8a, and the other surface of the resonator 5 to the grounding terminal plate 9 via its protuberance 9a. The output terminal plate 7 and the intermediate terminal plate 8 are contacted to each other, and thus the other surface of the resonator 4 is electrically connected to the one surface of the resonator 5 through these terminal plates. The other surface of the resonator 5 is grounded to the metal casing 1 through the grounding terminal plate 9. In this way, the piezoelectric resonators 4 and 5 is electro-mechanically held by pinching. An insulating plate 10 typically made of rubber is disposed at an location appropriate for the filter components to form an inverted L-connection ladder type filter circuit as illustrated in FIG. 1 and, in this embodiment, between the inner surface of the metal casing 1 and the input terminal plate 6 for electrically insulating the input terminal plate 6 and thus the resonator 4 from the inner wall surface of the metal casing 1.

The input and output terminal plates 6 and 7 are respectively provided with strip-shaped connector legs 11 and 12 which are outwardly extended from corresponding respective edges thereof.

The piezoelectric resonators 4 and 5, the terminal plates 6, 7, 8 and 9 and the insulating plate 10 are inserted into the space 3 of the metal casing 1 through the opening 2 and are sequentially stacked to each other within the space 3 with the connector legs 11 and 12 of the input and output terminal plates 6 and 7 externally extending through the opening 2 of the casing 1. The metal casing 1 plays the role of a grounding terminal as it abuts the grounding terminal plate 9, and is provided with a grounding connector leg 13 projecting in the direction of connector legs 11 and 12 of the input and output terminal plates 6 and 7 as an extension of a middle portion of the lower wall of the metal casing 1. The connector legs 11, 12 and 13 of the input terminal plate 6 and the output terminal plate 7 and the metal casing 1 are positioned so as not to be superimposed with respect to each other. The opening 2 of the metal casing 1 has a rugged or rough inner surface 2a (see FIG. 4) which may be formed by sand blasting.

After the stacked filter components 4 to 10 are inserted into the metal casing 1, the opening 2 of the metal casing 1 is closed by an insulating resin layer 14 formed by filling the opening 2 with elastic resin material such as elastic epoxy resin with a thin member of paper or the like (optionally) disposed thereon. In this connection, since the inner wall surface 2a of the opening 2 of the metal casing 1 is rough or rugged, the insulating resin layer 14 can be tightly bonded to the inner wall surface 2a so that no crevice can be formed therebetween. Therefore, the inner portion of the metal casing 1 can be airtightly maintained thereby making it possible to protect the metal casing from the penetration of moisture.

Figure 4:
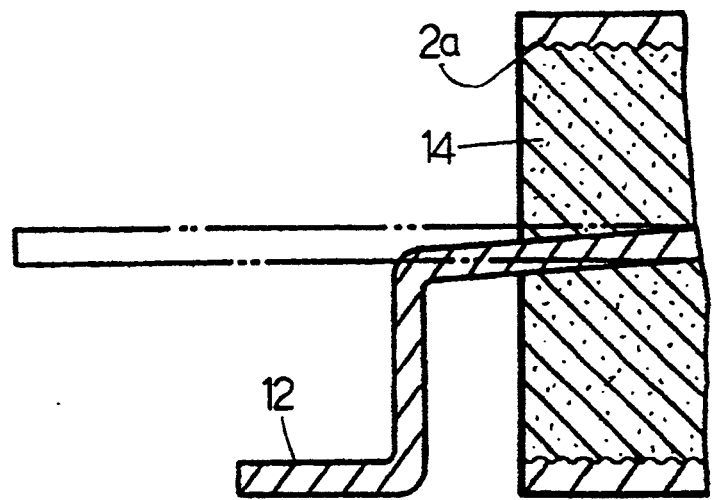
FIG. 4 is an enlarged longitudinal section schematically showing how a connector leg of the piezoelectric filter device shown in FIG. 3 is cranked.

Then as shown in FIG. 4 for leg 12 the input and output connector legs 11 and 12 of FIG. 3 extending outwardly from resin layer 14 are cranked, i.e., angled or bent into the shape of a crank, from the shape shown in phantom lines so that the distal end portions of these connector legs are disposed in the plane of the grounding connector leg 13 of FIG. 3 integrally extending from the lower wall of the metal casing 1.

Figure 5:
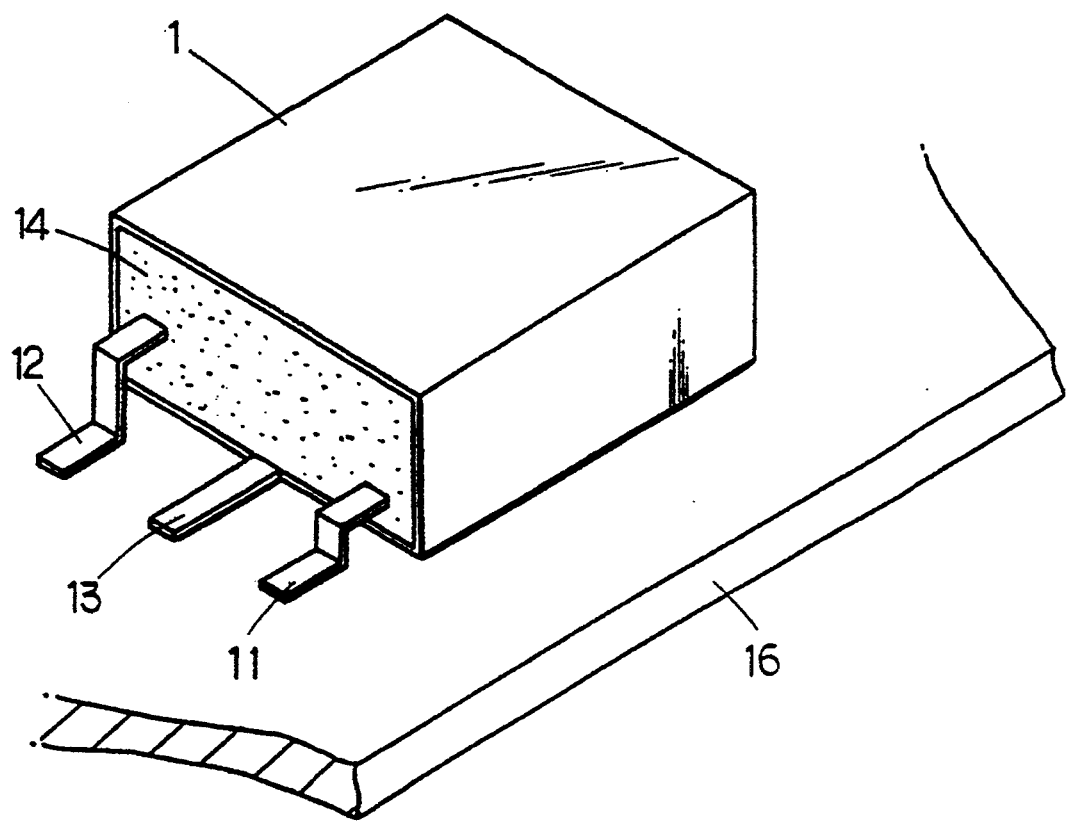
FIG. 5 is a perspective view showing the piezoelectric filter device of FIG. 3 mounted on a printed-circuit board.
Figure 6:
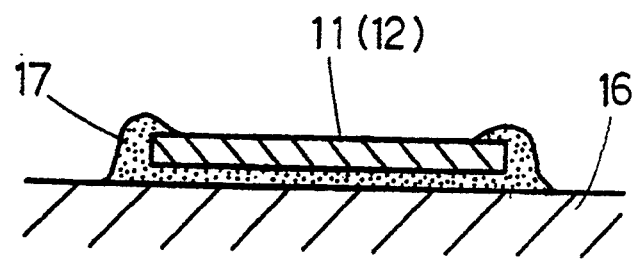
FIG. 6 is an enlarged schematic sectional view showing how the connector leg of the piezoelectric filter device is bonded to a soldering :paste layer on the printed-circuit board.

In this way, a filter device is prepared. The prepared filter device is surface-mounted on a printed circuit board 16 as shown in FIG. 5 by soldering. That is, each of the connector legs 11 and 12 extending outwardly from resin layer 14 is pressed on a heated soldering paste layer 17 for bonding as illustrated in FIG. 6, the soldering paste layer 17 on resin layer 16 may partly come up and sit on the connector leg to strengthen the bonding effect.

Figure 7:
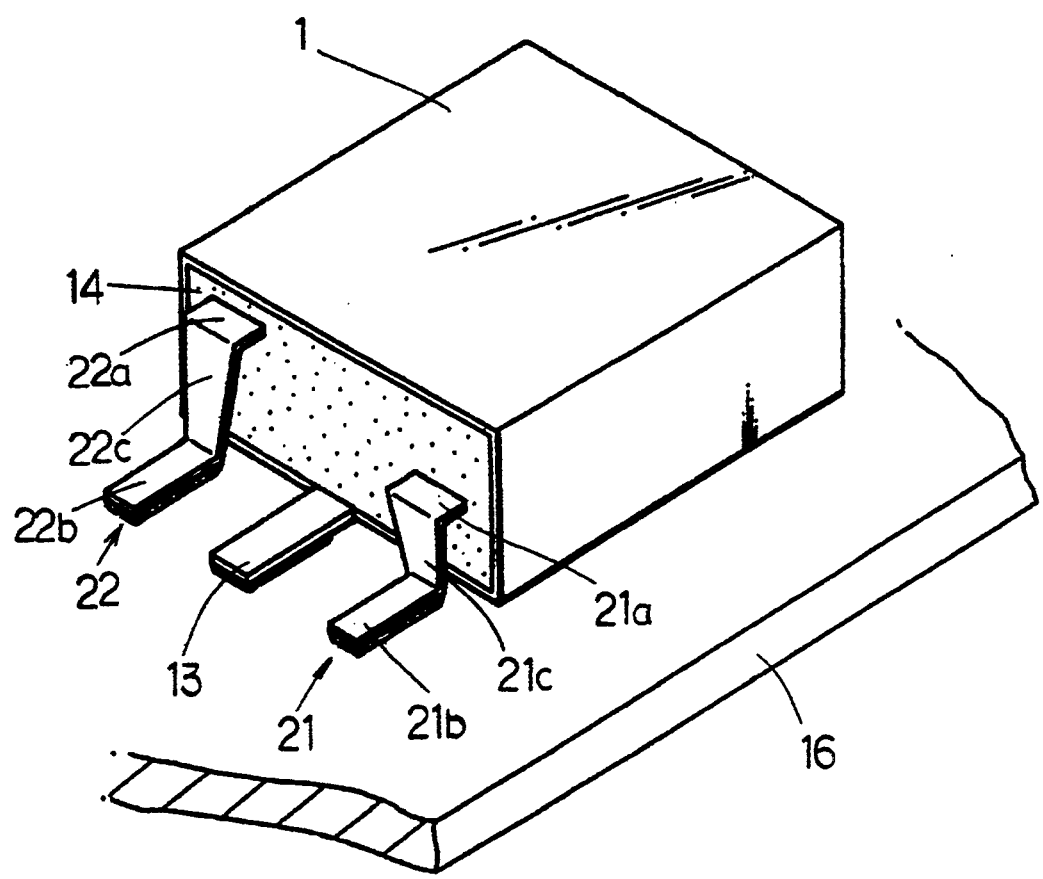
FIG. 7 is a perspective view showing a modification of the embodiment illustrated in FIGS. 3 to 6.

FIG. 7 illustrates a modification of the present invention in which components identical or similar to those of the above mentioned embodiment are designated by same reference numerals as used in FIGS. 3 to 6.

The filter device illustrated in FIG. 7 is similar to that above described with the exception of the arrangement of the connector legs.

The input and output terminal plates are provided with respective connector legs 21 and 22 each of which comprises a wider base portion 21a; 22a, a narrow tip portion 21b; 22b and a taper-shaped intermediate portion 21c; 22c. The respective connector legs are cranked or bent so that a first and second fold lines are formed between the wider base and taper-shaped intermediate portions and between the taper-shaped intermediate and tip portions, respectively. Since the input and output connector legs 21 and 22 are very thin but has the wider base portions, these connector legs may have a retaining force or stiffness so that they can be folded at a right angle when being cranked and they can not be deformed by any external force after cranked or bent.

It is, therefore, possible to retain the flatness of the input and output connector legs 21 and 22 at the free ends 21b and 22b which are to be electricaly connected with the respective conductive paths provided on the printed-circuit board 16. Thus, when the input and output connector legs 21 and 22 are connected with the respective conductive paths on the printed-circuit board 16 by means of soldering paste, the piezoelectric filter device will be kept horizontal and, therefore, parallel to the printed-circuit board 16. In such a way, the piezoelectric filter device can be surface-mounted on the printed-circuit board 16 in a neat and orderly manner as illustrated in FIG. 7.

Figure 8:
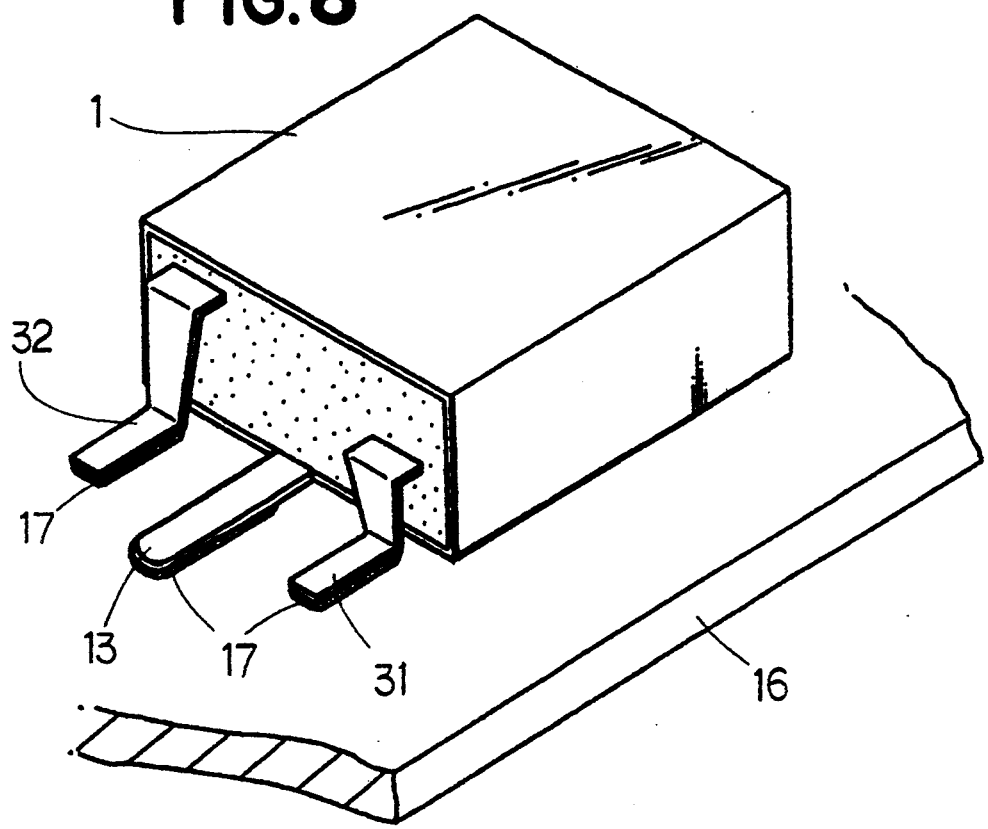
FIG. 8 is a perspective view showing a further modification of the embodiment illustrated in FIGS. 3 to 6.
Figure 9:
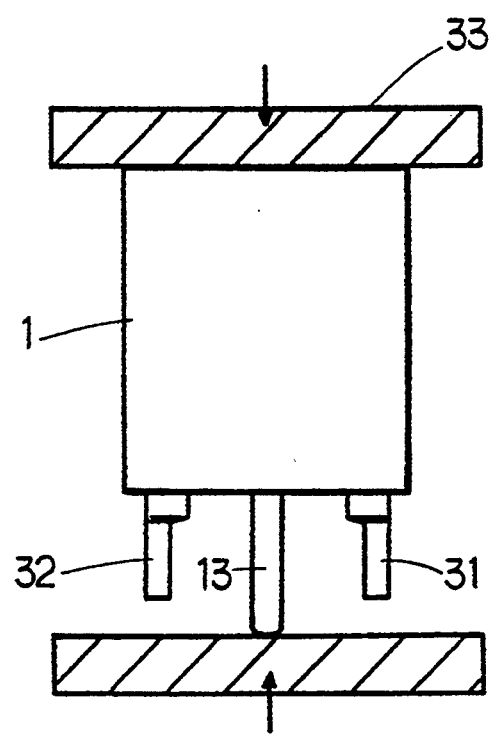
FIG. 9 is a plan view schematically showing how the piezoelectric filter device shown in FIG. 8 is held by a chucker at an assembling or mounting process.

FIGS. 8 and 9 illustrate a further modification of the present invention in which Components identical or similar to those of the above mentioned embodiment are designated by same reference numerals as used.

In this modification the input and output connector legs 31 and 32 are so designed that they show an identical length when cranked or bent into the desired shape. These input and output connector legs 31 and 32 are have a very small thickness of approximately 0.1 mm so that, when each of them is pressed on a heated soldering paste layer 17 for bonding as illustrated in FIG. 6, the soldering paste may partly come up and sit on the connector leg to strengthen the bonding effect. On the other hand, the grounding connector leg 13 has a length that exceeds the length of the input and output connector legs 31 and 32 when the latter are cranked or bent. Thus, as will be seen in FIG. 9 when the piezoelectric filter device is held by a chucker 33 and conveyed to a mounting station using a chip mounter, the chucker 33 holds it at the rear wall and the front end of the grounding connector leg 13 which projects beyond the input and output connector legs 31 and 32. Since the grounding connector leg 13 is an extension of the bottom wall of the metal casing 1 and rigid as it is thicker than the input and output connector legs 31 and 32, the piezoelectric filter device is immune from deformation when it is held by the chucker 33.

Thus, the input and output connector legs 31 and 32 retain their flatness at the free ends which are to be electrically connected with the respective conductive paths provided on the printed-circuit board 16. So, when the input and output connector legs 31 and 32 are connected with the respective conductive paths on the printed-circuit board 16 by means of soldering paste, the piezoelectric filter device will be kept horizontal and, therefore, parallel to the printed-circuit board 16. In other words, the piezoelectric filter device can be surface-mounted on the printed-circuit board 16 in a neat and orderly manner as illustrated in FIG. 8.

Figure 2:
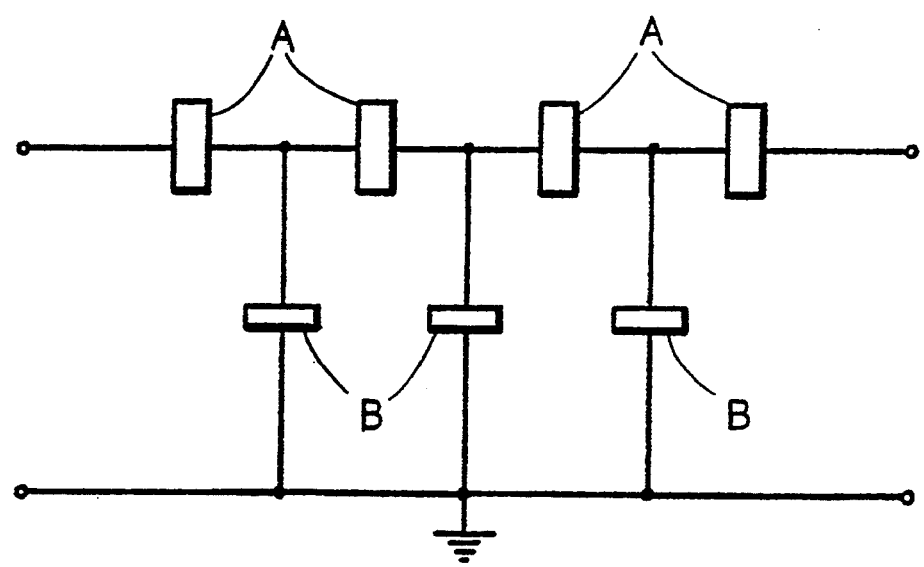
FIG. 2 is an equivalent circuit diagram of a ladder-type filter circuit having a multistage type filter unit.

In the illustrated embodiments described above, the filter device comprises a pair of piezoelectric resonators one being arranged on a series branch and the other being arranged on a parallel branch. It should, however, be understood that the filter device may comprise more than one pair of the piezoelectric resonators as illustrated in FIG. 2. Also, while the metal casing is grounded in the illustrated embodiments, it may be so modified that it is alternatively connected to an input or output terminal.

Further, while the metal casing is used for containing the filter assembly in the illustrated embodiments, it is possible to alternatively use a casing made of suitable plastic material. In that case, the grounding terminal plate may be provided with a connector leg having wider base portion.

As illustrated and described above, according to the present invention, by a provision of the rough inner surface in the opening of the casing the insulating filler can be securely bonded to the rough inner surface of the opening, and thus casing can be sealingly maintained without generating any crevices between the inner wall of the opening and the filler. It is, therefore, possible to provide a piezoelectric filter device having good waterproofing or moistureproofing characteristics.

Further, in case that the metal casing is provided with a connector leg which is longer than the cranked connector legs of the input and output terminal plates, the latter do not contact with the chucker and thus they are immune from any deformation when the filter device is conveyed by the chucker. Also, as the connector leg of the metal casing is an extension thereof, it is thick and rigid and, therefore, cannot be readily deformed by the force with which the chucker holds the piezoelectric filter device. Furthermore, in case that each connector leg to be cranked is constructed to have wider base portion, it is possible to fold the connector leg at a desired configuration without undesired deformation when it is cranked. Consequently, the present invention can provide a piezoelectric filter device which can be surface-mounted on the printed-circuit board in a neat and orderly manner.

It is to be understood that the above-mentioned embodiments are only illustrative of the application of the principles of the present invention. Numerous modifications and alterations maybe made by those skilled in the art without departing from the spirit and scope of the invention, and the appended claims are intended to cover such modifications and alterations.

We claim:

1. A piezoelectric filter device comprising at least one pair of piezoelectric resonators, a plurality of terminal plates, including input and output terminal plates, which are electrically connected to and mechanically support respective resonators of the at least one pair of resonators at oscillation nodes thereof, the input and output terminal plates being respectively provided with connecting legs having a configuration which is in the shape of a crank and which, in use, provide mounting of the piezoelectric filter device on a surface of a printed circuit board, a casing which houses the piezoelectric resonators and the terminal plates, at least one insulating plate disposed within said casing between one of said terminal plates and said casing, said resonators and terminal plates being connected together in stacked relation so as to define a ladder-type filter circuit, and said casing having an opening through which the connector legs externally project, and an insulating filler closing off the opening of the casing, the opening of the casing being provided with an inner peripheral rough surface which is bonded to the insulating filler, said casing including a lower wall and a connecting extension which extends from said lower wall, said connecting legs each having a free end, and said extension having a free end and being of a length, measured from the free end of said extension to said insulating filler, greater than the perpendicular distances between the free ends of the connecting legs of the terminal plates and the insulating filler.

2. A piezoelectric filter device according to claim 1, wherein each connecting leg of the terminal plates includes a main portion of a width larger than a width associated with a tip portion thereof which, in use, is to be connected to the printed-circuit board.

* * * * *